United States Patent

Nakata

[11] Patent Number: 6,078,059
[45] Date of Patent: Jun. 20, 2000

[54] FABRICATION OF A THIN FILM TRANSISTOR AND PRODUCTION OF A LIQUID DISPLAY APPARATUS

[75] Inventor: Yukihiko Nakata, Nara, Japan

[73] Assignee: Sharp Kabushiki Kaisha, Osaka, Japan

[21] Appl. No.: 08/948,141

[22] Filed: Oct. 9, 1997

Related U.S. Application Data

[63] Continuation of application No. 08/608,944, Feb. 29, 1996, abandoned.

[30] Foreign Application Priority Data

Jul. 10, 1992 [JP] Japan .................................... 4-268981

[51] Int. Cl.$^7$ ............................. H01L 29/78; H01L 33/00
[52] U.S. Cl. ................................ 257/57; 257/64; 257/66; 257/69
[58] Field of Search ................................. 257/57, 64, 66, 257/99

[56] References Cited

U.S. PATENT DOCUMENTS

| | | | |
|---|---|---|---|
| 5,403,756 | 4/1995 | Yoshinouchi et al. | 437/24 |
| 5,576,229 | 11/1996 | Murata et al. | 437/40 |
| 5,686,349 | 11/1997 | Nakata | 437/101 |
| 5,707,882 | 1/1998 | Hamada et al. | 437/21 |

FOREIGN PATENT DOCUMENTS

| | | |
|---|---|---|
| 0 062 079 | 10/1982 | European Pat. Off. . |
| 0 526 779 A1 | 2/1993 | European Pat. Off. . |
| 1 79259 | 4/1986 | Japan ........................................ 237/57 |
| 173640 | 7/1989 | Japan . |
| 2159021 | 6/1990 | Japan . |

OTHER PUBLICATIONS

Japanese Patent Abstract of JP4137525, published on May 12, 1992.
Japanese Patent Abstract of JP4266019, published on Sep. 22, 1992.
Otobe et al., Jpn. J. Appl. Appl. Phys., vol. 31, pp. 1948–1952 (1992).
K. Nomoto et al., Japanese Journal of Applied Physics, vol. 29, No. 8, pp. L1372–L1375 (1990).
Nakazawa et al., Japanese Journal of Applied Physics, vol. 28, No. 4, pp. 569–572 (1989).
Johnson et al., Apply. Phys. Lett. 53, 17 (1988).
Lampert, C.M., Solar Energy Materials, 11 85–95 (1984).
Matsuda, A., Journal of Non–Crystalline Solids 59 & 60, pp. 767–774 (1983).
Japanese Patent Publication of 60–98680, published on Jun. 1, 1985.
Japanese Patent Publication of 61–59873, published on Mar. 27, 1986.
Kanicki, J. et al., Mat. Res. Soc. Symp. Proc. 149 (1989).
Ikuta, K. et al., Non–Crystalline Solids 198–200:863–866 (1996).
Roca i Carraocas, P. et al., J. Non–Crystalline Solids 198–200:871–874 (1996).
Koynov, S. et al., J. Non–Crystalline Solids 198–200:1012–1016 (1996).

*Primary Examiner*—Stephen D. Meier
*Attorney, Agent, or Firm*—David G. Conlin; Robert L. Buchanan; Dike, Bronstein, Roberts & Cushman, LLP

[57] ABSTRACT

A thin film transistor includes: an insulating film having a surface; a semiconductor film formed on the surface of the insulating film; a source electrode and a drain electrode which are in contact with the semiconductor film; and a gate electrode which is electrically insulated from the semiconductor film. In the thin film transistor, a portion of the semiconductor film at distances of less than 500 angstroms from the surface of the insulating film contains at least silicon including a microcrystalline structure having a conductivity of $5\times10^{-9}$ S/cm or more. Also, a method for fabricating such a thin film transistor is disclosed. The method includes a step of forming a semiconductor film including a silicon layer having a microcrystalline structure by repeatedly performing the following steps (1) and (2): (1) forming a silicon layer on an insulating film by decomposing a material gas including Si which is introduced into a reaction chamber of a plasma chemical vapor deposition apparatus; and (2) microcrystallizing the silicon layer by introducing the hydrogen gas into the chamber to perform a hydrogen plasma treatment for the silicon layer.

6 Claims, 3 Drawing Sheets

FABRICATION OF A THIN FILM TRANSISTOR AND PRODUCTION OF A LIQUID DISPLAY APPARATUS

This application is a continuation of Ser. No. 08/608,944 filed Feb. 29, 1996 abandoned.

BACKGROUND OF THE INVENTION

1. Field of the Invention

The present invention relates to a thin film transistor (hereinafter referred to as "a TFT") used in a liquid crystal display apparatus and a method of producing the same, and also relates to a liquid crystal display apparatus.

2. Description of the Related Art

In a liquid crystal display apparatus, an active device such as a TFT is provided for each pixel, in order to display an image with high resolution. A number of TFTs can be formed over a large area, so as to be able to control a very large number of pixels.

Conventionally, as a semiconductor layer of a TFT, an amorphous silicon (a—Si) film formed by reactive plasma chemical vapor deposition using radio frequency discharge (RF-PCVD), a polycrystalline silicon (poly—Si) film obtained by first forming an a—Si film by thermal chemical vapor deposition (thermal CVD) and then recrystallizing the a—Si film by solid phase epitaxy or laser annealing, or another type of film has been used.

On the other hand, a silicon film including a microcrystalline structure ($\mu$c—Si) is prepared by RF-PCVD under conditions of a high RF power and a high dilution with hydrogen. It is known that, when the $\mu$c—Si is used for an amorphous silicon-based solar cell having a pin structure, the release voltage of the amorphous silicon-based solar cell is increased and the photoelectric conversion efficiency is improved. Also it is known that the $\mu$c—Si is prepared more easily with a higher RF power and a higher dilution with hydrogen.

In a case where a silicon film including the microcrystalline structure is prepared under conditions of a high RF power and a high dilution with hydrogen, the crystallization of silicon depends on the type of employed substrate and a thickness of the film. For example, Table 1 shows a relationship between a thickness and a dark conductivity of a p-type silicon film which is formed under conditions that the flow rate of $SiH_4$ including 0.7% $B_2H_5$ is 20 sccm, the flow rate of $H_2$ is 800 sccm, the substrate temperature is 260° C., the RF power density is 0.04 W/cm$^2$, and the pressure is 100 Pa.

TABLE 1

| Film Thickness | Dark Conductivity |
| --- | --- |
| 3000 Å | 5 × 10$^{-1}$ (S/cm) |
| 1000 Å | 2 × 10$^{-2}$ (S/cm) |
| 500 Å | 5 × 10$^{-11}$ (S/cm) |
| 200 Å | 5 × 10$^{-11}$ (S/cm) |

It is seen from Table 1 that, when the p-type silicon film which is formed under the above conditions has a thickness of 1000 angstroms or more, the dark conductivity thereof is higher than that of the film having a thickness of 500 angstroms or less by about nine orders. As is understood from the above, if the p-type silicon film which is formed under the above conditions has a thickness of 500 angstroms or less, the film is composed of a—Si. If the p-type silicon film has a thickness of 1000 angstroms or more, $\mu$c—Si is formed on a—Si having a thickness of 500 angstroms or more.

Table 2 shows a relationship between a thickness and a dark conductivity of an n-type silicon film which is formed under conditions that the flow rate of $SiH_4$ including 0.5% $PH_3$ is 20 sccm, the flow rate of $H_2$ is 1400 sccm, the substrate temperature is 260° C., the RF power density is 0.05 W/cm$^2$, and the pressure is 110 Pa.

TABLE 2

| Film Thickness | Dark Conductivity |
| --- | --- |
| 500 Å | 1.8 × 10$^0$ (S/cm) |
| 225 Å | 1.3 × 10$^{-1}$ (S/cm) |
| 150 Å | 2.2 × 10$^{-6}$ (S/cm) |

It is seen from Table 2 that, if the n-type silicon film which is formed under the above conditions has a thickness of 200 angstroms or less, the film is composed of a—Si. If the film has a thickness more than 200 angstroms, $\mu$c—Si is formed on a—Si having a thickness of about 200 angstroms.

As described above, conventionally, in a case where a silicon film is formed by performing depositions successively in a usual P-CVD apparatus, it is difficult to obtain $\mu$c—Si by microcrystallizing a—Si within a thickness of 500 angstroms after the start of deposition, even under the conditions for easily forming $\mu$c—Si, i.e., under conditions of a high RF power and a high dilution with hydrogen.

Generally in a TFT, the field-effect mobility in a very thin semiconductor layer which is in contact with an insulating film determines the amount of an ON current of the TFT. The thickness of the semiconductor layer is 1000 angstroms or less in a general TFT, and preferably about 200 to 600 angstroms. Therefore, if aft the semiconductor layer of a TFT is formed under conditions of the high RF power and the high dilution with hydrogen, the semiconductor layer is composed of a—Si. Thus, it is considered that the ON current of the TFT cannot be increased.

An article (1) specified below shows a method for forming $\mu$c—Si by repeatedly performing a formation of a silicon film and a hydrogen plasma treatment, with a usual RF-PCVD apparatus.

(1) K. Nomoto, Y. Urano, J. L. Guizot, G. Ganguly and A. Matsuda, "Role of Hydrogen Atoms in the Formation Process of Hydrogenated Microcrystalline Silicon", Japanese Journal of Applied Physics Vol. 29, No. 8, August, 1990, pp. L1372–L1375.

According to the method disclosed in the article (1), an a—Si film is first formed only by using $SiH_4$, and then a hydrogen plasma treatment is performed for the a—Si film. Then, after a predetermined time period, following the completion of the hydrogen plasma treatment, has elapsed, a next a—Si film is formed. However, there is no report that the above method is applied to a TFT.

In order to produce a large-sized liquid crystal display with high resolution, it is necessary to charge a capacitance formed by a liquid crystal layer and a storage capacitor in a short gate switching time period. However, in a TFT which uses the above a—Si film as a semiconductor layer, it is impossible to increase the ON current because of a low field-effect mobility of the semiconductor layer. In such a TFT, it is necessary to increase the size of the TFT so as to increase the ON current. This disadvantageously leads to a decrease in the opening ratio of the liquid crystal display apparatus.

On the other hand, in a TFT using the poly—Si film as a semiconductor layer, it is possible to increase the ON current of the TFT because of a high field-effect mobility of the semiconductor layer. However, in order to obtain a poly—Si film by crystallizing an a—Si film by solid phase epitaxy, it is necessary to perform an annealing process for about ten hours at temperatures of 600° C. or more. Therefore, it is difficult to use a usual glass substrate, and it is impossible to obtain a TFT having a large area. In another case where the poly—Si film is obtained by recrystallizing the a—Si film by laser annealing, it is necessary to use a low-speed and expensive laser annealing apparatus, so that the method is not suitable for mass production.

SUMMARY OF THE INVENTION

The thin film transistor of this invention includes: an insulating film having a surface; an i-type semiconductor film formed on the surface of the insulating film; a source electrode and a drain electrode which are in contact with the semiconductor film; and a gate electrode which is electrically insulated from the semiconductor film, wherein a portion of the semiconductor film at distances of less than 500 angstroms from the surface of the insulating film contains at least silicon including a microcrystalline structure having a conductivity of $5 \times 10^{-9}$ S/cm or more.

According to another aspect of the invention, a thin film transistor includes: an insulating film having a surface; a p-type or n-type semiconductor film formed on the surface of the insulating film; a source electrode and a drain electrode which are in contact with the semiconductor film; and a gate electrode which is electrically insulated from the semiconductor film, wherein a portion of the semiconductor film at distances of less than 500 angstroms from the surface of the insulating film contains at least silicon including a microcrystalline structure having a conductivity of $1 \times 10^{-3}$ S/cm or more.

According to another aspect of the invention, a thin film transistor includes: an insulating film having a surface; a semiconductor film formed on the surface of the insulating film; a source electrode and a drain electrode which are in contact with the semiconductor film; and a gate electrode which is electrically insulated from the semiconductor film, wherein a portion of the semiconductor film at distances of less than 500 angstroms from the surface of the insulating film contains at least silicon including a microcrystalline structure having an amount of bound hydrogen of 10 atomic percent or less.

According to another aspect of the invention, a thin film transistor includes: an insulating film having a surface; a semiconductor film formed on the surface of the insulating film; a source electrode and a drain electrode which are in contact with the semiconductor film; and a gate electrode which is electrically insulated from the semiconductor film, wherein a portion of the semiconductor film at distances of less than 500 angstroms from the surface of the insulating film contains at least silicon including a microcrystalline structure having crystalline volume fraction of 10% or more.

According to another aspect of the invention, a method for fabricating a thin film transistor is provided. The method includes a step of forming a semiconductor film including a silicon layer having a microcrystalline structure by repeatedly performing steps (1) and (2): (1) forming a silicon layer by decomposing a material gas including Si which is introduced into a reaction chamber of a plasma chemical vapor deposition apparatus; and (2) microcrystallizing the silicon layer by introducing the hydrogen gas into the chamber to perform a hydrogen plasma treatment for the silicon layer.

In one embodiment of the invention, the method further includes a step of performing a hydrogen plasma treatment for an upper surface of an insulating film on which the semiconductor film is formed, prior to the step of forming the semiconductor film on the insulating film.

In another embodiment of the invention, in the step of forming the silicon layer, the silicon layer is formed to have a thickness in the range of 1 to 1000 angstroms.

According to another aspect of the invention, a method for fabricating a thin film transistor is provided. The method includes: a first step for forming a silicon layer having a microcrystalline structure under a condition of a dilution ratio with hydrogen of 200 or more, the silicon layer having a thickness of 100 angstroms or less; and a second step for forming, on the silicon layer, another silicon layer having a microcrystalline structure under a condition of a dilution ratio with hydrogen of 2–100.

According to another aspect of the invention, a method for producing a liquid crystal display apparatus including thin film transistors is provided. In the method, a step of forming a semiconductor film for each of the thin film transistors includes a step of forming a semiconductor film composed of a silicon layer having a microcrystalline structure by repeatedly performing steps (1) and (2): (1) forming an amorphous silicon layer on a substrate by decomposing a material gas including Si introduced into a reaction chamber of a plasma chemical vapor deposition apparatus by plasma; and (2) performing a hydrogen plasma treatment for the amorphous silicon layer by introducing a hydrogen gas into the reaction chamber.

According to another aspect of the invention, a plasma chemical vapor deposition apparatus includes: a reaction chamber for forming a thin semiconductor layer and for performing a hydrogen plasma treatment for the thin semiconductor layer; a first line, coupled with the reaction chamber, for introducing a hydrogen gas into the reaction chamber; a second line, coupled with the reaction chamber, for introducing a material gas used for forming the thin semiconductor layer into the reaction chamber; a third line, coupled with the second line, for exhausting the material gas from the second line; and switching means for switching between the second line for introducing the material gas and the third line for exhausting the material gas.

According to another aspect of the invention, a plasma chemical vapor deposition apparatus includes: a reaction chamber for forming a thin semiconductor layer and for performing a hydrogen plasma treatment for the thin semiconductor layer; a first line, coupled with the reaction chamber, for introducing a hydrogen gas into the reaction chamber; a second line, coupled with the reaction chamber, for introducing a material gas used for forming the thin semiconductor layer into the reaction chamber; a third line, coupled with the second line, for exhausting the material gas from the second line; a first valve provided on the second line between the reaction chamber and a coupling portion of the second line and the third line; a second valve provided on the third line; and control means for controlling the opening and closing the first valve and the second valve, Wherein, when the thin semiconductor layer is formed, the control means controls the first valve to be open and the second valve to be closed, whereby the material gas is introduced into the reaction chamber, and when the hydrogen plasma treatment is performed for the thin semiconductor layer, the control means controls the second valve to be open and the first valve to be closed, whereby only the introduction of the material gas into the reaction chamber is stopped.

Thus, the invention described herein makes possible the advantages of (1) providing a TFT which can increase an ON current and which is inexpensive and suitable for mass production, and (2) providing a method of producing a large-sized liquid crystal display apparatus with high resolution including such a TFT.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described with reference to the drawings.

EXAMPLE 1

Figure 1:
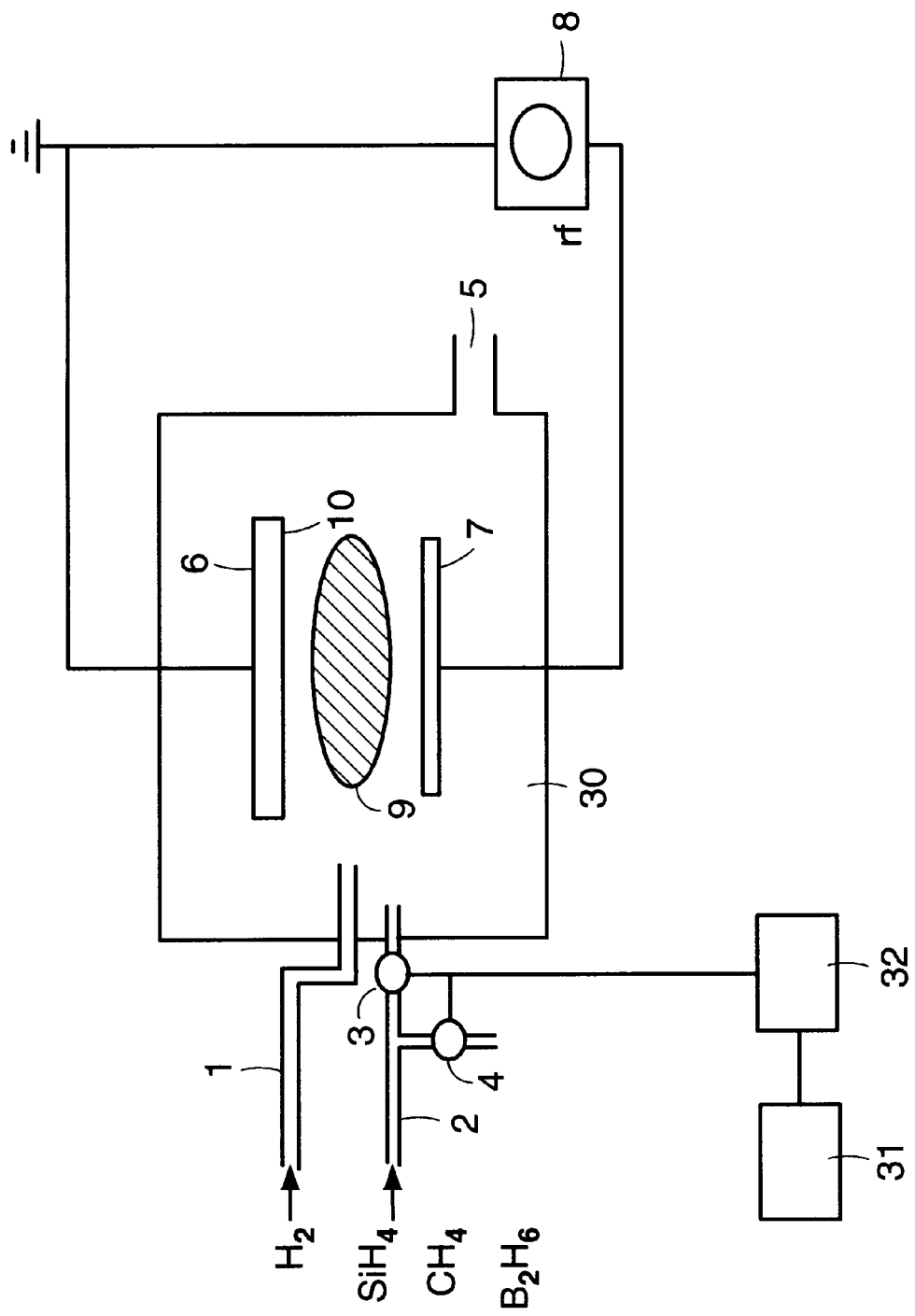
FIG. 1 shows an exemplary construction of an RF-PCVD apparatus capable of performing a hydrogen plasma treatment used in this invention.

First, a process for forming a $\mu c$—Si film will be described below. In this process, instead of a usual RF-PCVD apparatus, an RF-PCVD apparatus shown in FIG. 1 is used. This deposition apparatus includes, in addition to the components of the usual RF-PCVD apparatus, two gas introducing lines, i.e., a hydrogen gas introducing line 1 and a material gas introducing line 2. If a valve 3 for the material gas introducing line 2 is open, and a valve 4 is closed, the material gas as well as the hydrogen gas is introduced into a reaction chamber 30. If the valve 3 is closed and the valve 4 is open, the material gas is directly exhausted by an exhausting pump (not shown). Thus, only the hydrogen gas is introduced into the reaction chamber 30. The valves 3 and 4 are controlled by a control device 32 which is connected to a timer 31. As the result of the control of the valves 3 and 4, both the material gas and the hydrogen gas are introduced into the reaction chamber 30 during a certain predetermined period, and only the hydrogen gas is introduced into the reaction chamber 30 during the next certain predetermined period.

In the RF-PCVD apparatus shown in FIG. 1, a power is applied between an anode electrode 6 and a cathode electrode 7 by a radio frequency power supply 8, so that plasma 9 is generated. During the period in which the material gas and the hydrogen gas are introduced into the reaction chamber 30, the material gas and the hydrogen gas are decomposed in the plasma 9, and a Si layer is deposited on a substrate 10. During the period in which only the hydrogen gas is introduced, the Si layer which has been deposited on the substrate 10 is subjected to a hydrogen plasma treatment, that is, exposed to $H_2$-plasma. The deposition of a Si layer and the hydrogen plasma treatment therefor are repeatedly performed, so that a $\mu c$—Si film having a desired thickness can be obtained.

The formation of the $\mu c$—Si film in this example will be described below in more detail. First, through the material gas introducing line 2 provided in the RF-PCVD apparatus shown in FIG. 1, monosilane ($SiH_4$) as a material gas was introduced at a flow rate of 1 sccm, and diborane ($B_2H_6$) with a gas doping ratio of 1% as a doping gas was introduced into the reaction chamber 30. At the same time, hydrogen ($H_2$) was introduced through the hydrogen gas introducing line 1 at a flow rate of 100 sccm into the reaction chamber 30. Under conditions of the substrate temperature of 300° C., the RF power density of 1 W/cm$^2$, and the pressure of 100 Pa, a Si layer having a thickness of 10 angstroms was deposited on the substrate 10. Next, the valve 3 was closed and the valve 4 was opened, so that the introduction of the material gas was stopped. Thus, only the $H_2$ was introduced at a flow rate of 100 sccm, and the deposited Si layer was exposed to $H_2$-plasma. A cycle of such deposition of Si layer and hydrogen plasma treatment therefor was repeated, so that a $\mu c$—Si film having a thickness of 500 angstroms was finally obtained.

Figure 2:
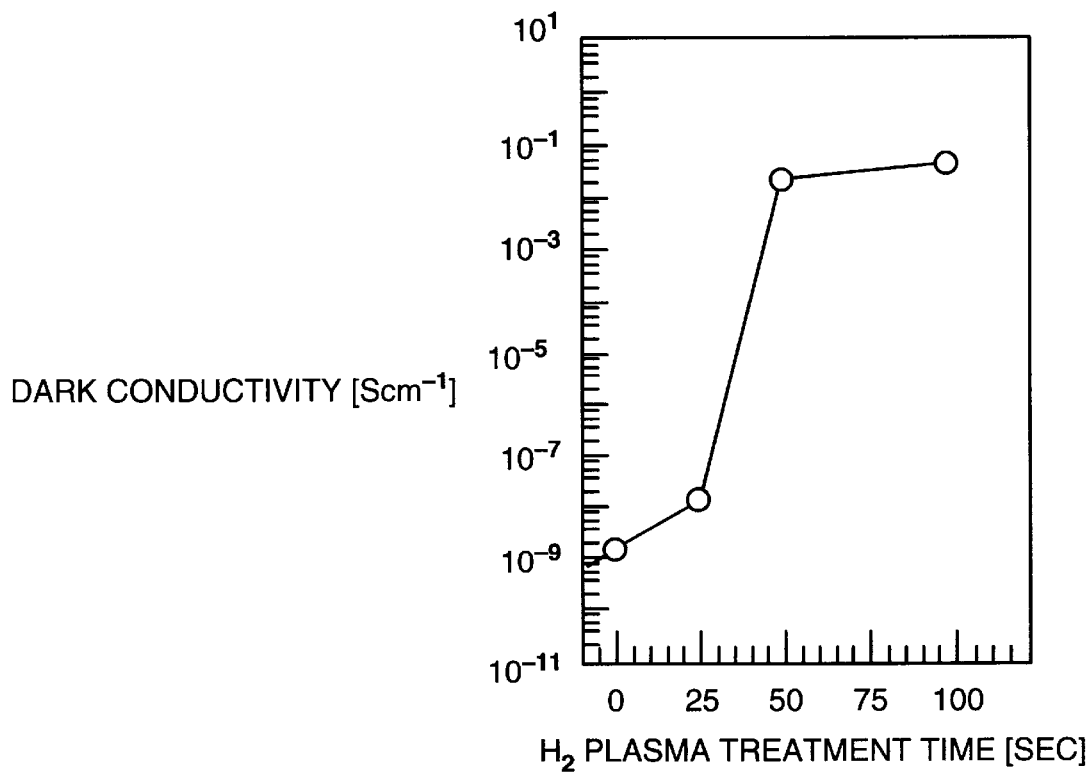
FIG. 2 is a graph illustrating a variation of the dark conductivity of a silicon film with respect to a time period for a hydrogen plasma treatment.

FIG. 2 shows a relationship between a time period in which the Hydrogen plasma treatment is performed in one-cycle and a dark conductivity of the silicon film which is thus formed. In this example, a power of 200W is applied. It is seen from this figure that, by performing the hydrogen plasma treatment for about 50 seconds in each cycle, the dark conductivity of the silicon film is drastically increased by about seven orders, and a dark conductivity of $1\times10^{-3}$ S/cm or more is obtained. This means that, in a very thin film, the crystalline structure is changed by the hydrogen plasma treatment for about 50 seconds, so that silicon film can have a microcrystalline structure in a region from the start of the deposition to the thickness of 500 angstroms or less in which such microcrystallization was difficult by the conventional method by which a film is formed by performing depositions successively.

In this example, a Si layer having a thickness of 10 angstroms was formed in one cycle. It is understood that the layer thickness formed in one cycle may be 1–1000 angstroms, and preferably 5–100 angstroms in the case where the crystalline structure of the layer is changed by the hydrogen plasma treatment as described above.

The amount of bound hydrogen in the $\mu c$—Si film which was formed by repeating the above cycle was quantified to be 4–10 atomic percent by infrared spectroscopy, while the amount of bound hydrogen in a usual a—Si film is 13–20 atomic percent. This is because the amount of bound hydrogen in crystal Si which is included in the $\mu c$—Si film together with a—Si is approximately 0 atomic percent.

Then, the composition analysis was performed for the film which was thus formed, and the film was analyzed by reflected high-energy electron diffraction and Raman spectroscopy. As a result, the film thus formed was ascertained to be a silicon film including the microcrystalline structure.

Then, the Raman scattering spectrum of the $\mu c$—Si film was divided into a broad peak specific to a—Si at about 480 cm$^{-1}$, and a sharp peak of crystal Si, i.e., a peak of the Si—Si binding at 520 cm$^{-1}$. Based on the integrated intensity ratio of these peaks, the crystalline volume fraction which represented the crystal Si percentage of the $\mu c$—Si film was measured. As a result, the crystalline volume fraction was 0% in the a—Si film formed by usual CVD under the usual conditions for forming an a—Si film deposition, and in the silicon film formed to have a thickness of 500 $\mu$m or less by the P-CVD method without a hydrogen plasma treatment. On the other hand, in the $\mu c$—Si film which was formed by repeating the deposition of an a—Si layer under conditions of a high RF power and a high dilution with hydrogen and the hydrogen plasma treatment as described above, the crystalline volume fraction was 10% or more, and at best, a μc—Si film with the crystalline volume fraction of 70% was obtained.

In the above method, when the a—Si film was deposited, a p-type μc—Si film was formed by using diborane ($B_2H_6$) as a doping gas. Alternatively, an n-type μc—Si film can be formed by using a phosphine ($PH_3$) gas instead of diborane ($B_2H_6$). If such a doping gas is not used, an i-type μc—Si film is obtained. The conductivity of this i-type μc—Si film is $5 \times 10^{-9}$ S/cm or more.

In the above article (1), in order to analyze the influence on the microcrystallization of the silicon layer by $H_2$, the deposition of a next silicon layer is started after a certain time period, following the completion of the hydrogen plasma treatment, has elapsed. Therefore, according to the method described in the article (1), the throughput is reduced. On the other hand, according to the method of this example, the deposition of the a—Si layer and the hydrogen plasma treatment are continuously performed without any interval, so that the throughput cannot be reduced.

The method described in the article (1) has a problem that the pressure variation is large because the introduction of $SiH_4$ and $H_2$ is switched over, that is, only $SiH_4$ is introduced for the deposition of an a—Si layer and only $H_2$ is introduced for the hydrogen plasma treatment into the reaction chamber. However, according to this example, the hydrogen gas introducing line 1 and the material gas introducing line 2 are additionally provided for the usual RF-PCVD apparatus, and the valves 3 and 4 for the material gas introducing line 2 are controlled by the control device 32 which is connected to the timer 31, so that only the introduction of the material gas can be stopped. Therefore, the total flow rate of the material gas and the hydrogen gas introduced into the reaction chamber 30 is varied between the deposition of an a—Si layer and the hydrogen plasma treatment by about 1%, so that the pressure variation in the reaction chamber 30 can be suppressed.

EXAMPLE 2

Another method for forming a silicon film which includes microcrystalline structure from the beginning of the formation will be described.

First, a material gas including $SiH_4$ and a hydrogen gas are introduced into the reaction chamber of an RF-PCVD apparatus. Then, under conditions that the dilution ratio with hydrogen ($SiH_4/H_2$ ratio) is 200 or more, and the power density is 0.03–1.5 W/cm$^2$ (preferably 0.1–0.3 W/cm 2), a silicon layer is deposited to have a thickness of about 100 angstroms. Thereafter, the flow rate of hydrogen gas is changed so that the dilution ratio with hydrogen becomes 2–100. Under a condition that the power density is 0.03–1.5 W/cm$^2$, another silicon layer is deposited on the preciously deposited silicon layer.

In this example, a silicon layer was first deposited to have a thickness of about 100 angstroms under conditions that the flow rate of $SiH_4$ was 1 sccm, the flow rate of $H_2$ was 1000 sccm, the power density was 1 W/cm$^2$, the substrate temperature was 300° C., and the pressure was 100 Pa. Then, the flow rate of $H_2$ was changed to be 70 sccm, and another silicon layer was deposited on the previously deposited silicon layer. Finally, the resulting silicon film had a thickness of 100 angstroms.

The silicon film thus formed was analyzed by the infrared absorption spectral method, reflective electron beam diffraction, Raman spectroscopy or the like. As a result, the silicon film was ascertained to be a μc—Si film. The amount of bound hydrogen in the μc—Si film was 0, and the crystalline volume fraction was 30% or more. Moreover, the dark conductivity of the i-type μc—Si film was measured to be $2 \times 10^{-8}$ S/cm or more. According to this method, a very good dark conductivity could be obtained.

In this example, the dilution ratio with hydrogen is very high such as 200 or more, and the silicon layer is deposited. Therefore, the deposition rate is very slow such as 0.05 angstroms per second or less. However, a microcrystalline silicon layer can be obtained even with thicknesses of about 100 angstroms or less from the beginning of the formation of the film. Since the μc—Si layer is first deposited up to the thickness of about 100 angstroms from the beginning of the film formation with very high dilution with hydrogen, a successive silicon layer also includes the microcrystalline structure influenced by the previously deposited μc—Si layer. When the μc—Si layer is deposited to have a thickness of about 100 angstroms from the beginning of the film formation, the dilution with hydrogen is changed to be 2–100. Therefore, the deposition rate can be increased to 0.2–0.3 angstroms per sec. As a result, a silicon film which includes the microcrystalline structure even in the layers with the thicknesses of 100 angstroms or less from the beginning of the film formation can be formed to have a desired thickness.

Figure 3:
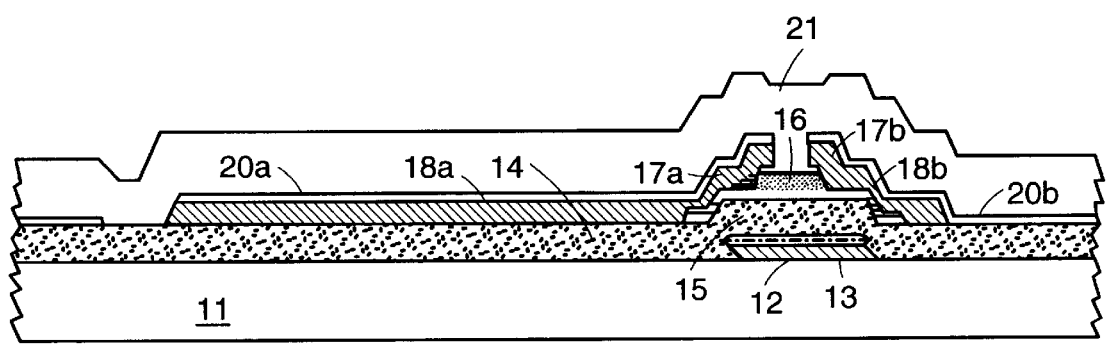
FIG. 3 is a cross-sectional view showing the main portions of a liquid crystal display apparatus of an example according to the invention.

FIG. 3 shows the main portions of a liquid crystal display apparatus including TFTs in which semiconductor layers are formed by the method shown in Example 1 described above.

In this liquid crystal display apparatus, on a glass substrate 11, a gate electrode 12 is formed. On the surface of the gate electrode 12, an anode oxide film 13 is formed. A gate insulating film 14 is formed so as to cover the entire top face of the substrate 11. A p-type μc—Si semiconductor layer 15 is formed on the gate insulating film 14 so as to overlap the gate electrode 12. On the center portion of the semiconductor layer 15, an etching stopper 16 is formed. A thin source film 17a and a thin drain film 17b are formed so as to cover the end portions of the etching stopper 16 and portions of the semiconductor layer 15, respectively. The thin source film 17a and the thin drain film 17b are separated from each other on the etching stopper 16.

On the thin source film 17a, a source electrode 18a is formed. On the thin drain film 17b, a drain electrode 18b is formed. A passivation film 20a is formed on the source electrode 18a, and a pixel electrode 20b is formed on the drain electrode 18b. Moreover, a passivation film 21 is formed so as to cover the entire top face of the substrate 11 as a uppermost layer.

The above-mentioned liquid crystal display apparatus is fabricated in the following manner.

First, a thin tantalum (Ta) film having a thickness of about 300 nm is formed by sputtering on a glass substrate 11. The thin Ta film is patterned by photolithography and etching, so as to form a gate electrode 12. Thereafter, the substrate 11 is immersed in an ammonium tartrate solution, and a current is caused to flow from the outside so as to anodize the substrate 11. As a result, an anode oxide insulating film 13 having a thickness of 300 nm is formed on the gate electrode 12.

Figure 4:
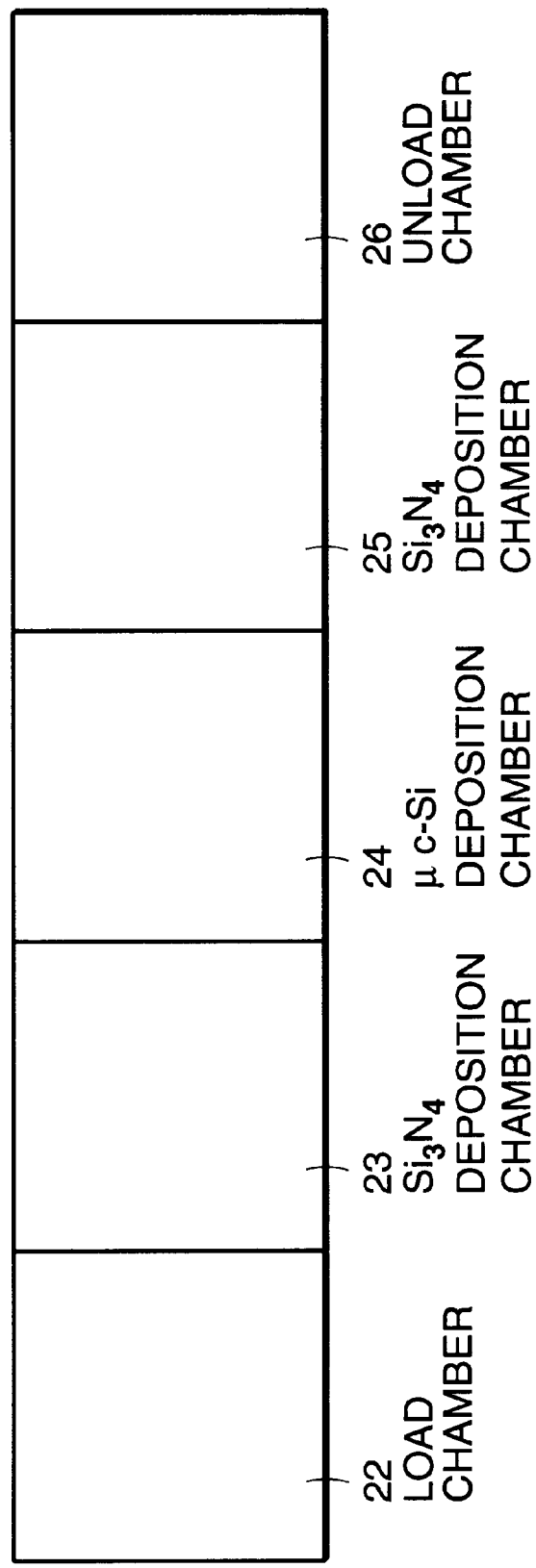
FIG. 4 is a diagram showing an in-line CVD apparatus used for the present invention.

Next, by using an in-line type CVD apparatus shown in FIG. 4, an $Si_3N_4$ film for a silicon nitride ($Si_3N_4$) film 14, a μc—Si film 15 and an etching stopper 16 is formed. First, a glass substrate 11 is transported from a load chamber 22 to an $Si_3N_4$ deposition chamber 23. Monosilane ($SiH_4$), ammonia ($NH_3$) and hydrogen ($H_2$) are introduced into the $Si_3N_4$ deposition chamber 23, so as to induce plasma discharge. As a result, an $Si_3N_4$ gate insulating film 14 having a thickness of 300 nm is formed.

Next, the glass substrate 11 is transported to the μc—Si deposition chamber 24, and a μc—Si film 15 is deposited on the gate insulating film 14. The deposition conditions are set such that the flow rate of monosilane ($SiH_4$) as a material gas is 1 sccm, diborane ($B_2H_6$) with a gas doping ratio of 1% is used as a doping gas, the flow rate of hydrogen ($H_2$) is 100 sccm, the power density is 0.7 $W/cm^2$, the substrate temperature is 300° C., and the pressure is 100 Pa. Under the above conditions, a Si layer having a thickness of 10 angstroms per cycle is first grown. Next, by applying a power having a power density of 0.7 $W/cm^2$, the hydrogen plasma treatment is performed for about 50 seconds. Such deposition of a Si layer and the hydrogen plasma treatment are repeated, so as to form a p-type μc—Si film 15 having a thickness of 300 angstroms.

Thereafter, the glass substrate 11 is transported to an $Si_3N_4$ deposition chamber 25. Monosilane ($SiH_4$), ammonia ($NH_3$), and hydrogen ($H_2$) are introduced into the $Si_3N_4$ deposition chamber 25, whereby an $Si_3N_4$ film having a thickness of 300 nm is formed on the μc—Si film 15 by plasma discharge. When the deposition of $Si_3N_4$ film is completed, the glass substrate 11 is transported through the unload chamber 26. The $Si_3N_4$ film is patterned so as to form an etching stopper 16. Next, an $n^+$-doped Si film is formed by CVD or the like, and then patterned so as to form a thin source film 17a and a thin drain film 17b.

Next, by sputtering, titanium (Ti) is laminated to be about 300 nm in thickness, and then patterned so as to form a source electrode 18a and a drain electrode 18b. In this example, the channel length and the channel width are set to be 10 μm and 40 μm, respectively.

Thereafter, by using a target of indium oxide including 5% tin (Sn), in an oxygen atmosphere, sputtering is performed so as to form an indium oxide film to be about 70 nm in thickness. The indium oxide is patterned so as to form a passivation film 20a and a pixel electrode 20b on the source electrode 18a and the drain electrode 18b, respectively. Then, an $Si_3N_4$ film having a thickness of 330 nm is formed and patterned so as to form a passivation film 21.

As described above, a substrate 11 with TFTs which is one of a pair of substrates of a liquid crystal display apparatus, as shown in FIG. 3, is formed.

In this state, the characteristics of a TFT which is formed by the above-described method are measured. The ON current when a gate voltage of 10 V is applied is $1.5 \times 10^{-6}$ A or more, which is about one and a half times of that in the case where an a—Si film is used as the semiconductor layer.

Thereafter, a glass plate which is the other one of the pair of substrates of the liquid crystal display apparatus and on which a color filter, a black matrix, and an ITO electrode are formed is laminated to the glass substrate 11 with a space therebetween, and liquid crystal is injected into the space. A polarizing plate is laminated to each of the substrates, and a back light is attached, whereby a liquid crystal display apparatus is produced.

As described above, according to the above method, the ON current of a TFT can be improved, so that a liquid crystal display apparatus for an engineering work station having a size of 16 inches and having 1280×1024 pixels which was difficult to realize in the prior art can be produced.

In addition, the semiconductor layer for the TFT can be formed at a low temperature, so that a glass substrate which is inexpensive can be used.

In the above example, the p-type μc—Si film is used as the semiconductor layer for the TFT. This invention is not limited to this specific type, but an i-type or n-type μc—Si can be used.

In the above example, the μc—Si film as the semiconductor layer for the TFT is formed by a method shown in Example 1. However, the μc—Si film may be formed by a method shown in Example 2.

The above example is described by using a TFT having a reversed stagger structure. Alternatively, by using a TFT having a stagger structure, the same effects can be attained.

As apparent from the above description, according to the present invention, a TFT with superior field-effect mobility can be fabricated at a low cost by using a large-sized substrate. Therefore, a large-sized liquid crystal display apparatus for an engineering work station with high resolution can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film transistor comprising:
   a substrate;
   a gate electrode formed on said substrate;
   an insulating film having a surface, said insulating film covering said gate electrode;
   an i-type semiconductor film formed on said surface of said insulating film; and
   a source electrode and a drain electrode which are in contact with said semiconductor film;
   wherein said semiconductor film has a thickness of less than about 1,000 angstroms and a portion of said semiconductor film at distances of about 500 angstroms or less from said surface of said insulating film contains at least silicon including a microcrystalline structure having a conductivity of $5 \times 10^{-9}$ S/cm or more.

2. A thin film transistor comprising:
   a substrate;
   a gate electrode formed on said substrate;
   an insulating film having a surface, said insulating film covering said gate electrode;
   a p-type or n-type semiconductor film formed on said surface of said insulating film; and
   a source electrode and a drain electrode which are in contact with said semiconductor film;
   wherein said semiconductor film has a thickness of less than about 1,000 angstroms and a portion of said semiconductor film at distances of 500 angstroms or less from said surface of said insulating film contains at least silicon including a microcrystaline structure having a conductivity of $1 \times 10^{-3}$ S/cm or more.

3. A thin film transistor comprising:
   a substrate;
   a gate electrode formed on said substrate;
   an insulating film having a surface, said insulating film covering said gate electrode;
   a semiconductor film formed on said surface of said insulating film; and
   a source electrode and a drain electrode which are in contact with said semiconductor film,
   wherein said semiconductor film has a thickness of less than about 1,000 angstroms and a portion of said semiconductor film at distances of 500 angstroms or less from said surface of said insulating film contains at least silicon including a microcrystalline structure having an amount of bound hydrogen of 10 atomic percent or less.

4. A thin film transistor comprising:
- a substrate:
- a gate electrode formed on said substrate;
- an insulating film having a surface said insulating film covering said gate electrode;
- a semiconductor film formed on said surface of said insulating film;
- a source electrode and a drain electrode which are in contact with said semiconductor film;
- wherein said semiconductor film has a thickness of less than about 1,000 angstroms and a portion of said semiconductor film at distances of 500 angstroms or less from said surface of said insulating film contains at least silicon including a microcrystalline structure having crystalline volume fraction of 10% or more.

5. A thin film transistor, comprising:
- a substrate;
- a gate electrode formed on said substrate;
- an insulating film having a surface, said insulating film covering said gate electrode;
- an i-type semiconductor film formed on said surface of said insulating film; and
- a source electrode and a drain electrode which are in contact with said semiconductor film,
- wherein said semiconductor film has a thickness of less than about 1,000 angstroms and a portion of said semiconductor film at distances of about 500 angstroms or less from said surface of said insulating film contains at least silicon including a microcrystalline structure having a conductivity of $5\times10^{-9}$ S/cm or more, and amount of bound hydrogen of 10 atomic percent or less, and crystalline volume fraction of 10% or more.

6. A thin film transistor, comprising:
- a substrate;
- a gate electrode formed on said substrate;
- an insulating film having a surface, said insulating film covering said gate electrode;
- a p-type or n-type semiconductor film formed on said surface of said insulating film; and
- a source electrode and a drain electrode which are in contact with said semiconductor film,
- wherein said semiconductor film has a thickness of less than about 1,000 angstroms and a portion of said semiconductor film at distances of about 500 angstroms or less from said surface of said insulating film contains at least silicon including a microcrystalline structure having a conductivity of $1\times10^{-3}$ S/cm or more, an amount of bound hydrogen in the range from 4 atomic percent to 10 atomic percent, and crystalline volume fraction in the range from 10% to 70%.

* * * * *